(12) United States Patent
Rezeanu

(10) Patent No.: US 8,397,034 B1
(45) Date of Patent: Mar. 12, 2013

(54) MULTI-PORT ARBITRATION SYSTEM AND METHOD

(75) Inventor: Stefan-Cristian Rezeanu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 1409 days.

(21) Appl. No.: 10/847,531

(22) Filed: May 17, 2004

Related U.S. Application Data

(60) Provisional application No. 60/483,284, filed on Jun. 27, 2003.

(51) Int. Cl.
*G06F 12/00* (2006.01)
(52) U.S. Cl. ...................................................... 711/152
(58) Field of Classification Search .................. None
See application file for complete search history.

(56) References Cited

U.S. PATENT DOCUMENTS

| | | | |
|---|---|---|---|
| 4,535,428 A | 8/1985 | Furman | |
| 4,554,645 A | 11/1985 | Furman | |
| 4,616,347 A | 10/1986 | Bernstein | |
| 4,742,487 A | 5/1988 | Bernstein | |
| 4,811,296 A * | 3/1989 | Garde ....................... | 365/189.02 |
| 4,905,188 A * | 2/1990 | Chuang et al. ................. | 711/128 |
| 5,036,491 A | 7/1991 | Yamaguchi | |
| 5,276,842 A | 1/1994 | Sugita | |
| 5,289,427 A | 2/1994 | Nicholes et al. | |
| 5,384,734 A | 1/1995 | Tsujihashi et al. | |
| 5,398,211 A | 3/1995 | Willenz et al. | |
| 5,434,818 A * | 7/1995 | Byers et al. ............... | 365/189.04 |
| 5,459,851 A | 10/1995 | Nakajima et al. | |
| 5,502,683 A | 3/1996 | Marchioro | |
| 5,726,584 A * | 3/1998 | Freidin ........................... | 326/38 |
| 5,737,569 A | 4/1998 | Nadir et al. | |
| 5,751,638 A * | 5/1998 | Mick et al. ............... | 365/189.04 |
| 5,768,211 A | 6/1998 | Jones et al. | |
| 5,978,897 A * | 11/1999 | Nakagawa ..................... | 712/200 |
| 6,049,487 A * | 4/2000 | Plants et al. ............. | 365/189.04 |
| 6,108,756 A * | 8/2000 | Miller et al. .................. | 711/148 |
| 6,181,634 B1* | 1/2001 | Okita ....................... | 365/230.05 |
| 6,212,607 B1* | 4/2001 | Miller et al. .................... | 711/149 |
| 6,430,088 B1* | 8/2002 | Plants et al. ............. | 365/189.04 |
| 6,629,195 B2* | 9/2003 | Schroeder et al. ............ | 711/108 |
| 6,934,816 B2* | 8/2005 | Matthews et al. ............. | 711/149 |
| 7,415,594 B2* | 8/2008 | Doerr et al. ..................... | 712/15 |
| 7,650,585 B1* | 1/2010 | Miller et al. .................... | 716/16 |
| 2002/0199057 A1* | 12/2002 | Schroeder et al. ............ | 711/108 |
| 2003/0037208 A1* | 2/2003 | Matthews et al. ............. | 711/149 |

FOREIGN PATENT DOCUMENTS

JP 01309159 A * 12/1989

OTHER PUBLICATIONS

NN85091690, IBM Technical Disclosure Bulletin,"Valid Output Indicator of Multi-Port Arrays", vol. 28, Issue 4, pp. 1690-1693, Sep. 1, 1985.*
USPTO Notice of Allowance for U.S. Appl. No. 08/688,904 (CD96038) dated Jul. 8, 1997; 3 pages.
USPTO Non-Final Rejection for U.S. Appl. No. 08/688,904 (CD96038) dated Feb. 6, 1997; 5 pages.
"16K × 8/9 Dual-Port Static RAM with Sem, Int, Busy," Cypress Semiconductor Data Book, May 1995, CY7C006 and CY7C016, pp. 6:1-17; 10 pages.
"4K × 16/18 and 8K × 16/18 Dual-Port Static RAM with Sem, Int, Busy," Cypress Semiconductor Data Book, May 1995, CY7C024/ 0241 and CY7C025/0251, pp. 6:18-36; 11 pages.

(Continued)

*Primary Examiner* — Kevin Verbrugge

(57) ABSTRACT

A multi-port arbitration system has a write detection circuit coupled to each of a number of ports. An address coincidence detector is coupled to each of the ports. A deactivation pulse generator circuit is coupled to the address coincidence detector.

6 Claims, 5 Drawing Sheets

OTHER PUBLICATIONS

"1K × 8 Dual-Port Static RAM," Cypress Semiconductor Data Book, May 1995, CY7C130/CY7C131 and CY7C140/CY7C141, pp. 6:37-49; 8 pages.

"2K × 8 Dual-Port Static RAM," Cypress Semiconductor Data Book, May 1995, CY7C132/CY7C136 and CY7C142/CY7C146, pp. 6:50-62; 8 pages.

"2K × 16 Dual-Port Static RAM," Cypress Semiconductor Data Book, May 1995, CY7C133 and CY7C143, pp. 6:63-73; 7 pages.

"4K × 8 Dual-Port Static RAM and 4K × 8 Dual-Port Static Ram with Semaphores," Cypress Semiconductor Data Book, May 1995, CY7B134 and CY7B135 and CY7B1342, pp. 6:74-86; 8 pages.

"4K × 8/9 Dual-Port Static RAM with Sem, Int, Busy," Cypress Semiconductor Data Book, May 1995, CY7B138 and CY7B139, pp. 6:87-102; 10 pages.

"8K × 8/9 Dual-Port Static RAM with Sem, Int, Busy," Cypress Semiconductor Data Book, May 1995, CY7B144 and CY7B145, pp. 6:103-120; 11 pages.

* cited by examiner

MULTI-PORT ARBITRATION SYSTEM AND METHOD

RELATED APPLICATIONS

The present invention claims priority on provisional patent application Ser. No. 60/483,284, filed on Jun. 27, 2003, entitled "Method and Apparatus for Pulsed Arbitration Synchronous Multi-Port Memories" and assigned to the same assignee as the present invention.

FIELD OF THE INVENTION

The present invention relates generally to the field of electronic circuits and more particularly to a multi-port arbitration system and method.

BACKGROUND OF THE INVENTION

Memory circuits with a number of access ports have become very popular and widely used in data communications and processing systems. One of the challenges associated with multi-port memories is how to resolve the situation where two ports attempt to access the same memory location at the same time. This situation can result in corruption of the stored data or corruption of the read-out data. A number of arbitration schemes have been proposed. One of the problems with prior art solutions is that they were developed to target two port memories. One arbitration solution is to use a priority scheme that gives priority to one of the ports. A flow chart illustrating the most common system, including the priority scheme solution, is shown in FIG. 1. The process starts, step 10, by determining if two ports are attempting to access the same cell at step 12. When the two ports are not attempting to access the same cell, the process waits for the beginning of the next cycle at step 14, and then repeats. When the two ports are attempting to access the same cell, the arbitration condition is latched favoring the priority channel at step 16. Next, the predecoder lines of the interfering port are inactivated for at least the duration of the overlapping addresses at step 18. This solution results in significantly limiting the performance of the non-priority or lower priority ports. Another problem found in the prior art is that the arbitration system locks out ports when there are multiple reads and no write operations. Yet another problem with some of the prior art solutions is that they block the other port(s') array access for a complete arbitration winning port's clock cycle. Since the clocks are generally asynchronous, the arbitration winning port's clock may have a significantly longer clock cycle than the other port(s) attempting to access the same memory cell. As a result, the losing port(s) may be blocked for multiple clock cycles, significantly reducing its/their performance.

Thus, there exists a need for a multi-port arbitration scheme that does not have priority channels, allows multiple simultaneous reads and does not block a port for any longer than is necessary.

SUMMARY OF INVENTION

A multi-port arbitration system that overcomes these and other problems has a write detection circuit coupled to each of a number of ports. An address coincidence detector is coupled to each of the ports. A deactivation pulse generator circuit is coupled to the address coincidence detector. An output of the write detection circuit may be logically combined with an output of the address coincidence detector. An output of the logical combination is a disable signal. The disable signal is coupled to the deactivation pulse generator circuit.

In one embodiment, the number of ports is greater than two. A separate clock is provided for each of the ports. These clocks may be asynchronous.

A method of multi-port arbitration includes the steps of determining if any of the ports are attempting a write operation. When one of the ports is attempting the write operation, a read operation is blocked from another of the ports. In one embodiment, it is determined if any of the ports are attempting to access the same address. When any of the ports are attempting to access the same address, a read operation from another of the ports is blocked. When none of the ports are attempting to access the same address, all of the ports are allowed to perform an operation. When two or more of the ports are attempting the write operation to the same address, all operations are invalidated.

In one embodiment, the read operation is blocked during an internal write pulse. The read operation may be blocked during the write pulse plus a margin of error. When none of the ports are attempting the write operation, the read operation by any of the ports attempting the read operation is allowed.

A multi-port arbitration system has a write detection circuit coupled to each of a number of ports. The number of ports is greater than two. A deactivation pulse generator circuit is coupled to the write detection circuit. An address coincidence detector is coupled to the deactivation pulse generator circuit. The address coincidence detector may be a full address coincidence detector. An output pulse of the deactivation pulse generator has a pulse width that is similar to a pulse width of an internal write pulse. The output pulse is coupled to an address decoder. In one embodiment, the ports have a clock and each clock is asynchronous.

DETAILED DESCRIPTION OF THE DRAWINGS

Figure 1:
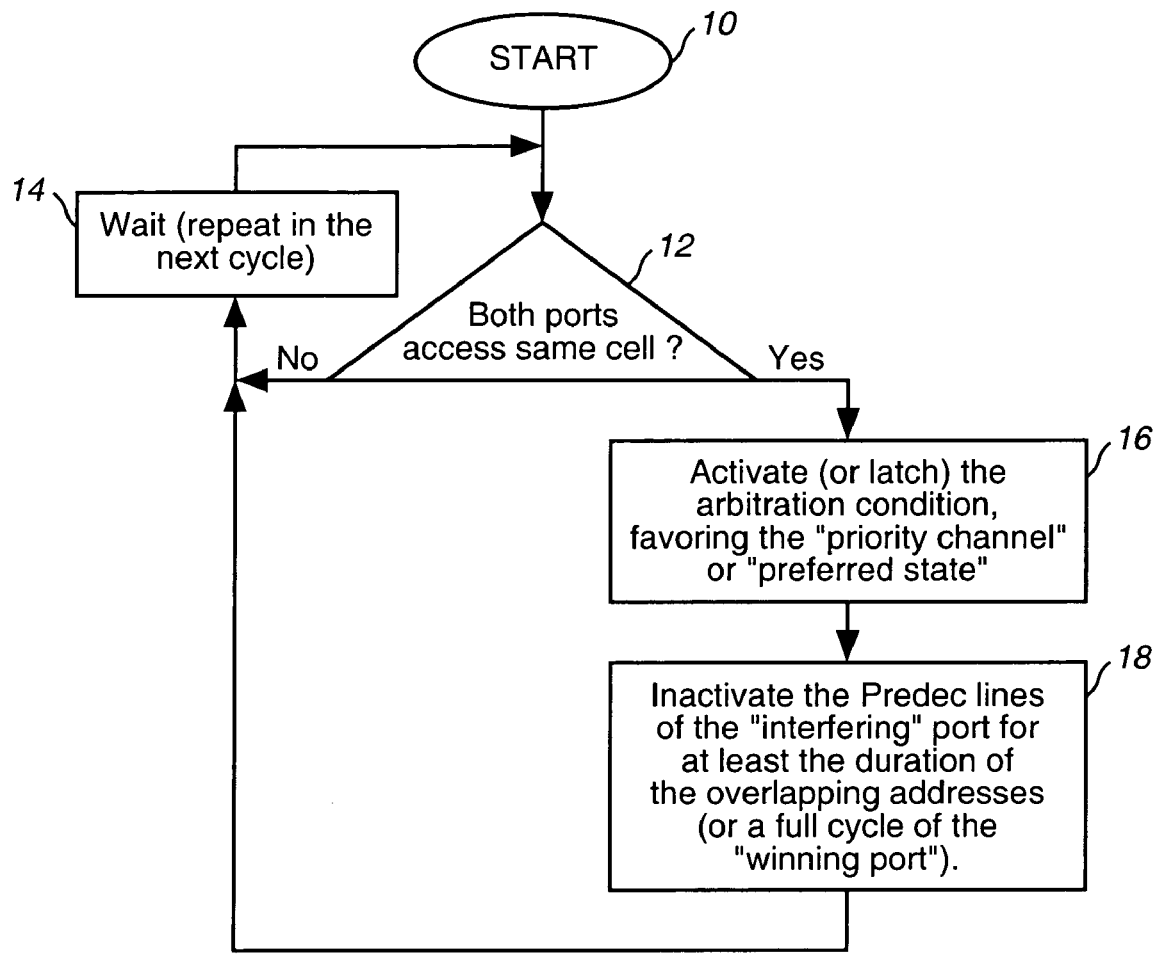
FIG. 1 is a flow chart of a typical arbitration scheme for multi-port memories.
Figure 2:
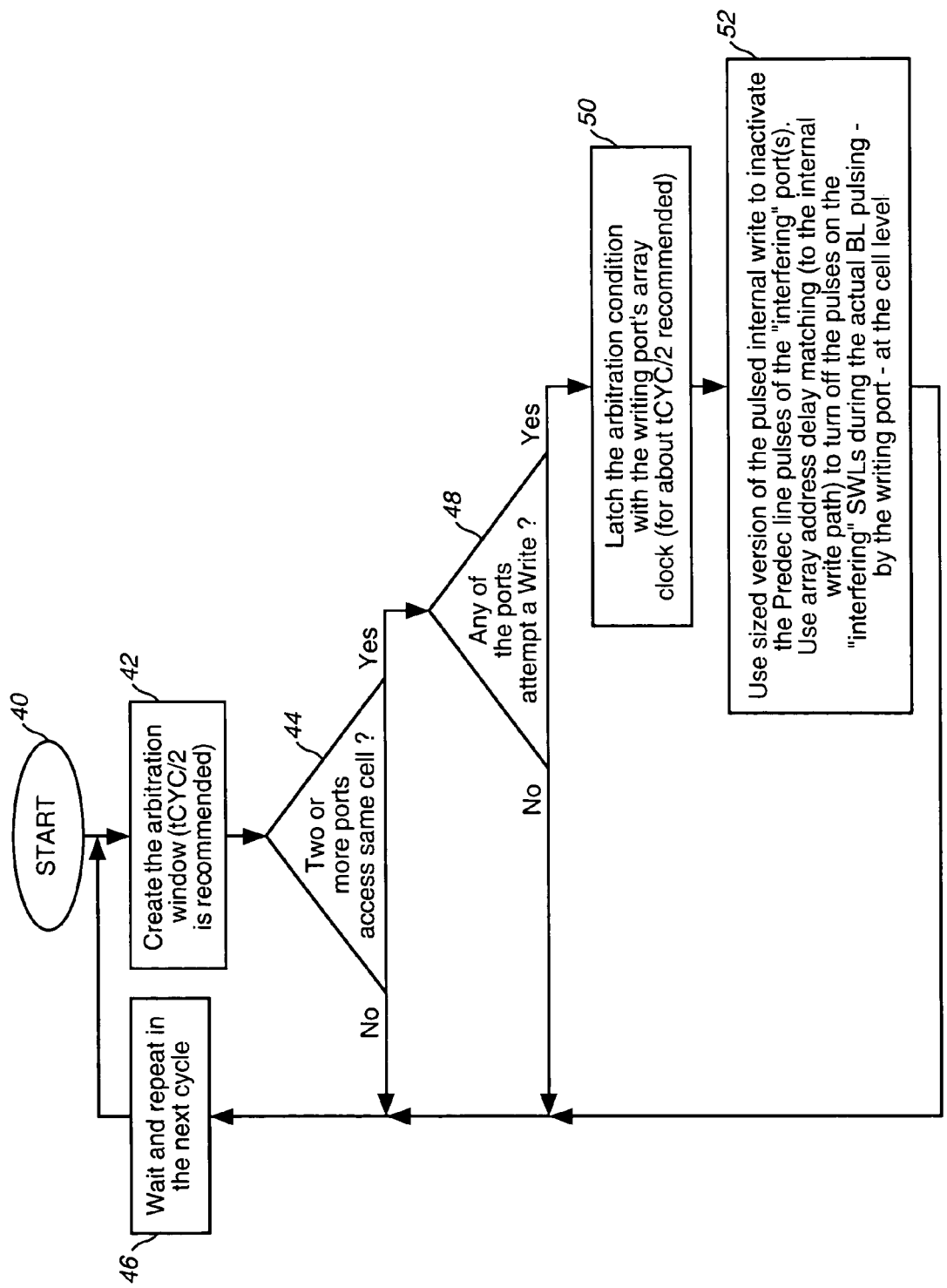
FIG. 2 is a flow chart of the steps used in a multi-port arbitration method in accordance with one embodiment of the invention.

The multi-port arbitration system described herein works for multiple ports, without the need for a priority channel. FIG. 2 is a flow chart of the steps used in a multi-port arbitration method in accordance with one embodiment of the invention.

The process starts, step 40, by creating an arbitration window at step 42. The arbitration window, in one embodiment, is set to about half the minimum cycle time (period) any of the clocks could run at (tCYC/2). Next, it is determined if two or more ports are attempting to access the same cell at step 44. When two or more ports are either not attempting to access the same cell, or they only attempt to read the same cell, the process waits for the next cycle at step 46. When two or more cells are attempting to access the same cell, the determination of whether any of the ports is attempting a write operation is made at step 48. When none of the ports is attempting a write operation, the process proceeds to step 46. When any of the ports is attempting a write operation, the arbitration condition is latched/registered with the writing port's array clock at step 50. In one embodiment, the latch condition is for less than tCYC, but not less than tCYC/2. The interfering port(s) pre-decoder line pulses are blocked by a sized version of the pulsed internal write signal of the arbitration winning port, at step 52. The array address delay is matched to the internal write pulse path delay, in order to turn off the pulses on the "interfering" sub-word lines (SWL) during the actual bit line (BL) pulsing by the writing port at the cell level. The process then proceeds to step 46 and repeats. The reason for blocking reads during writes is that the extra load imposed by the read lines can prevent the target cell from retaining the data to be written. As a result, the goal is to limit the block out period just long enough to ensure the write operation is successful and the written cell is in a stable logic condition.

Figure 3:
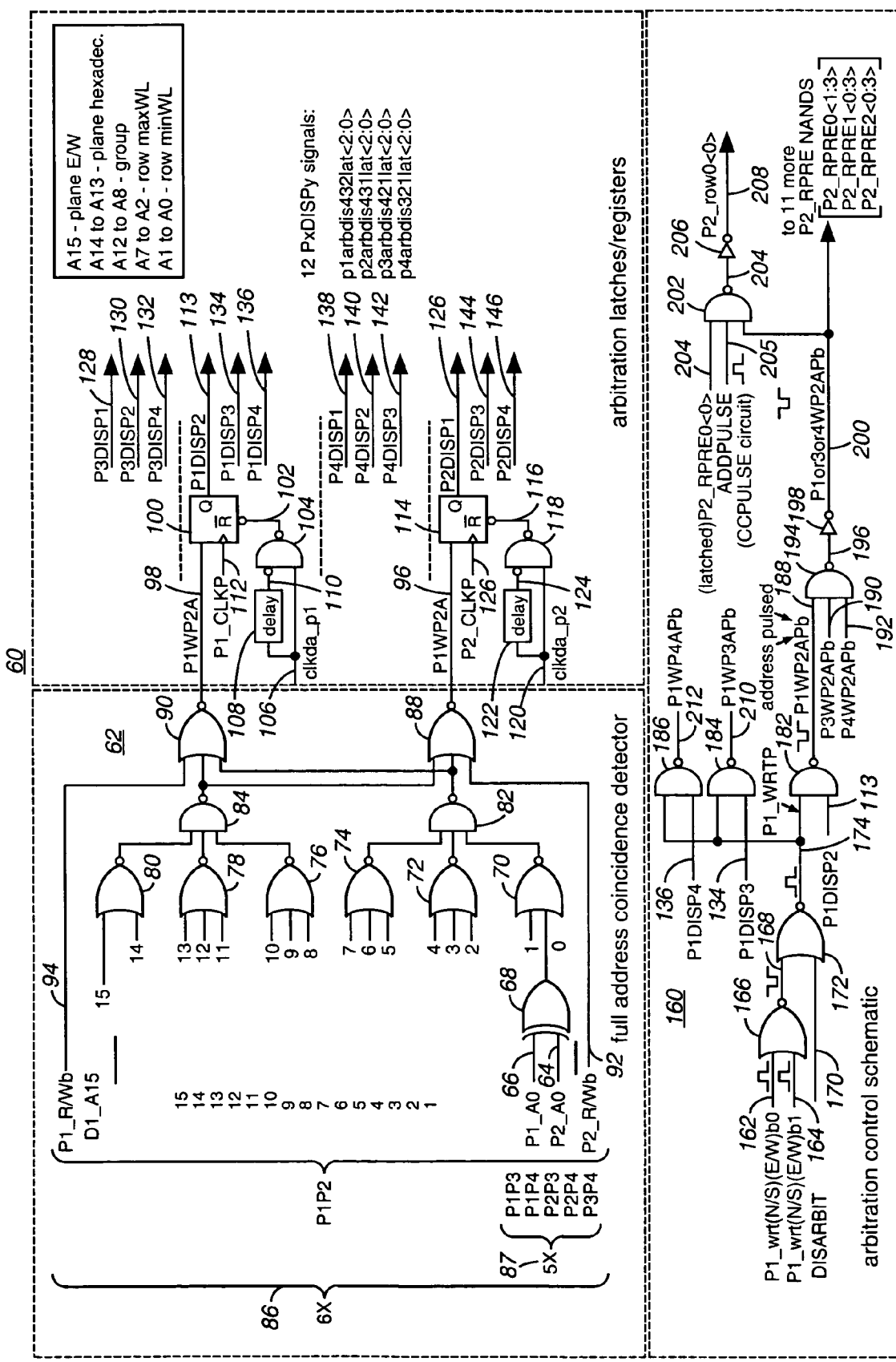
FIG. 3 is a symbolic logical diagram of an arbitration control scheme in accordance with one embodiment of the invention.

FIG. 3 is a logical diagram of a system 60 for multi-port arbitration in accordance with one embodiment of the invention. The system 60 has a full address coincidence detector circuit 62. The example shown in the figure assumes a sixteen line or bit address. The zero bits 64, 66 from ports one and two are coupled to an XOR gate 68 and although this not shown, this is done for all sixteen bits. The outputs of the XOR gates 68 are coupled to a six NOR gates 70, 72, 74, 76, 78, 80. The NOR gate 70 combines the comparison of the bits 0-1, the NOR gate 72 combines the comparison of the bits 2-4, the NOR gate 74 combines the comparison of the bits 5-7, the NOR gate 76 combines the comparison of the bits 8-10, the NOR gate 78 combines the comparison of the bits 11-13 and the NOR gate 80 combines the comparison of the bits 14-15. The outputs of NOR gate 70, 72 & 74 form the input to NAND gate 82. The outputs of NOR gates 76, 78, 80 form the input to NAND gate 84. The output of NAND gates 82 & 84 combined, e.g., in a NOR, would essentially produce the active high output of a full address coincidence detector. In the example, the outputs are combined in both the NOR gates 88 & 90 to form full address coincidence detectors. Note that the full address coincidence detector 62 described so far is for two ports. When four ports are used we need six (86) full address coincidence detectors 87 describing the other five needed combinations of the ports. The outputs of NAND gates 82 & 84 are coupled to NOR gates 88 & 90. The third input of NOR gate 88 is a port two (P2) read/write signal 92. The third input of the NOR gate 90 is a port one (P1) read/write signal 94. The output 96 of NOR gate 88 indicates if there is an address coincidence between port one and port two and whether port two is attempting a write. Note that both the address and write signals have been previously registered for a full clock cycle. When there is an address coincidence between these ports and port two is attempting a write then the output 96 is true or a disable signal. The output 98 of NOR gate 90 indicates if there is an address coincidence between port one and port two and whether port one is attempting a write. When there is an address coincidence between these ports and port one is attempting a write then the output 98 is true or a disable signal.

The output 98 of the NOR gate 90 is a port one write disable port two signal and forms the input to a flip flop 100. The other input (an active low reset 102) to the flip flop 100 is the output of a NAND gate 104. The inputs to the NAND gate 104 are an arbitration-window-delayed version of the port one clock 106 and a delay circuit 108 that delays the port one clock 106 and sets the duration of the reset pulse 102. Note that the second input 110 of the NAND gate 104 is inverted. The flip flop 100 is strobed by the port one clock 112. The delay circuit 108 and the NAND gate 104 form a reset pulse generator circuit for the flip flop 100. The output 113 is a port one disables port two signal which is always reset by the reset pulse 102 after the arbitration window elapses.

The output 96 of the NOR gate 88 is a port two write disable port one signal and forms the input to a flip flop 114. The other input (an active low reset 114) to the flip flop 114 is the output of a NAND gate 118. The inputs to the NAND gate 118 are an arbitration-window-delayed version of the port two clock 120 and a delay circuit 122 that delays the port two clock 120 and sets the duration of the reset pulse 116. Note that the second input 124 of the NAND gate 118 is inverted. The flip flop 114 is strobed by the port two clock. The delay circuit 122 and the NAND gate 118 form a reset pulse generator circuit for the flip flop 114. The output 126 is a port two disables port one signal which is always reset by the reset pulse 116 after the arbitration window elapses.

Note that there are similar circuits that generate a port three disables port one signal 128, a port three disables port two signal 130, a port three disables port four signal 132, a port one disables port three signal 134, a port one disables port four signal 136, a port four disables port one signal 138, a port four disables port two signal 140, a port four disables port three signal 142, a port two disables port three signal 144, a port two disables port four signal 146. This example assumes a four port device; however, the concept can be extended to any number of ports and any size address space. In addition, the system will block all operations if two or more writes occur to the same address space. For instance, both the port one disable port two signal 113 and the port two disable port one signal 126 will be valid if port one and port two are attempting to write to the same memory cell and all operations will be blocked. An arbitration control scheme 160 for the disable signals 113, 126, 128, 130, 132, 134, 136, 138, 140, 142, 144, 146 has the byte zero port one write signal 162 and the byte one port one write signal 164 forming the inputs to a NOR gate 166. This assumes that two bytes are going to each block/group of the memory array, for illustration of the general concept. The output 168 of the NOR gate 166 and disable arbitration signal 170 form the inputs to a NOR gate 172. When the disable arbitration signal 170 is on or true, then the output 174 of the NOR gate 172 blocks the port one disable port two signal 113, and blocks the port one disable port three signal 134, and blocks the port one disable port four signal 136. In other words, P1 is thus prevented to block any of the other 3 ports. This is accomplished by combining the output 113 with port one disables port two signal 176 in a NAND gate 182. The output 174 is also combined with the port one disables port three signal 134 in NAND gate 184 and with port one disables port four signal 136 in NAND gate 186. Note that, on the other hand, when the DISARBIT signal 170 is inactive (off, at logic zero), the pulsed write signal for P1 174 gets propagated through any of the NAND gates 182, 184, or 186 that is activated by the P1 DISPX signal (113, 134, or 136) being active. (In this example X can be 2, 3, or 4) The output 188 of NAND gate 182 is called P1WP2APb (because it can propagate a low-going pulse indicating that P1 is writing the P2 address) and is combined with the similarly generated port three writes port two signal 190, and the port four writes port two signal 192 in the NAND gate 194. If any of the signals 188, 190, 192 indicate that port two should be disabled (by presenting a low-going pulse at the NAND gate 194), the output 196 of the NAND gate 194 will pulse high and ultimately cause port two to be disabled. The output 196 forms the input of inverter 198. The output 200 is an input to NAND gate 202 and can be a low-going pulse, indicating that P1 or P3 or P4 is/are writing the P2 address (hence the name of signal 200: P1or3or4WP2APb). The NAND gate 202 also has a latched/registered port two bit zero RPRE0 row predecoded signal 204 as an input. A clock pulse 205 (to be transmitted as an address pulse) is also an input to NAND gate 202. The output 204 forms an input to inverter 206. The output 208 of the inverter 206 is the bit zero of the port two row zero pulsed predecoded row address signal. A similar circuit to the gate combination driven by signal 113 (NANDs 182, 194, 202 and inverters 198 and 206) are used for the other disable signals 126, 128, 130, 132, 134, 136, 138, 140, 142, 144, 146. Note that the output 210 of NAND 184 goes through a similar set of circuitry as output 188 and that output 212 of NAND 186 also goes through a similar set of circuitry.

Figure 4:
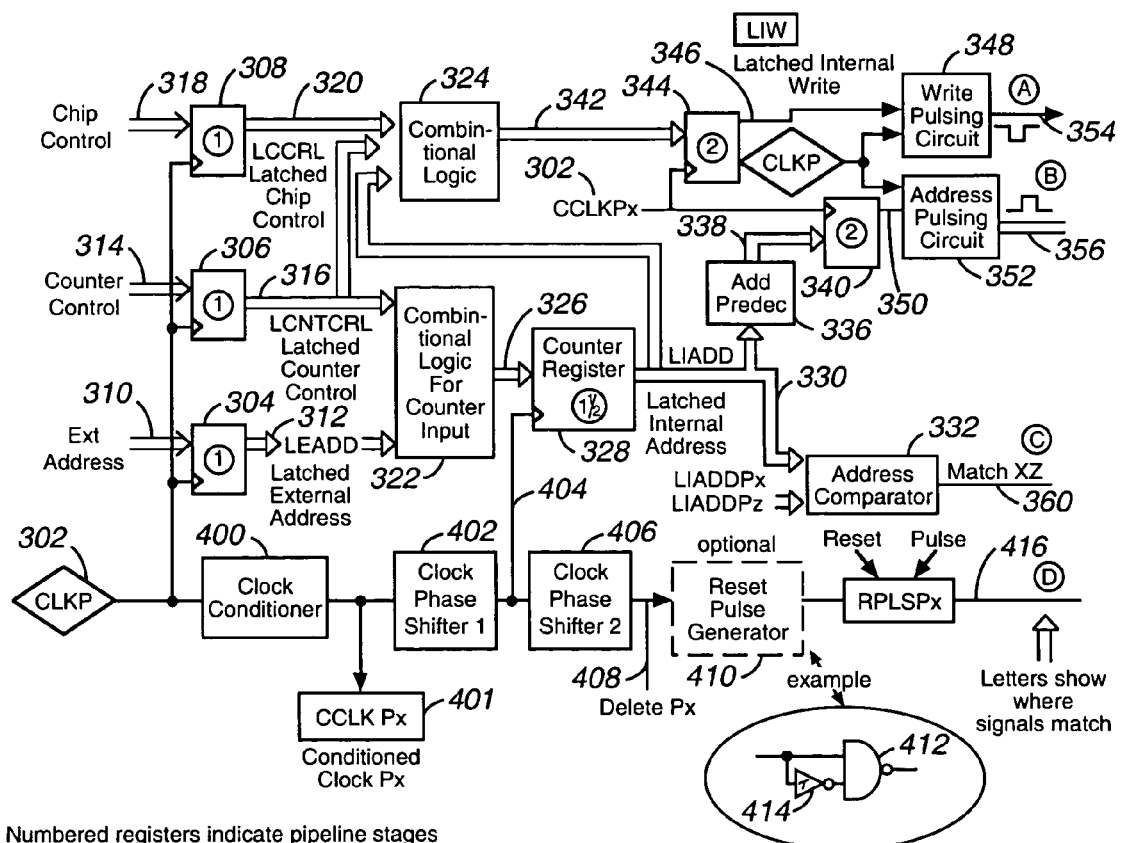
FIG. 4 is a block diagram of a system for multi-port arbitration in accordance with one embodiment of the invention.
Figure 4:
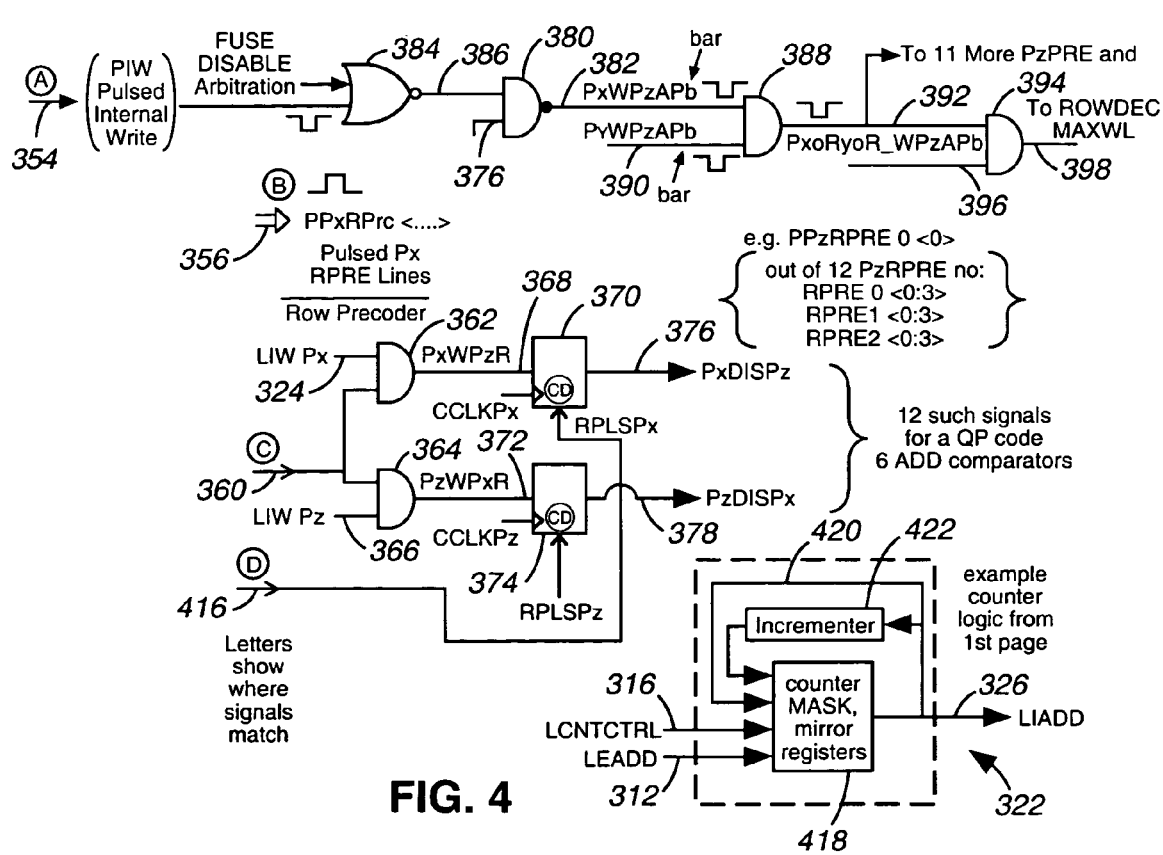

FIG. 4 is a block diagram of a system 300 for multi-port arbitration in accordance with one embodiment of the invention. The port "x" clock 302 is coupled to a first flip flop 304, second flip flop 306 and third flip flop 308. The first flip flop (actually multiple flip flops) 304 has the external address 310 as an input and a latched external address (LEADD) 312 as its output. The flip flop(s) 306 has as its input the counter controls 314 for the memory circuit and the latch counter controls (LCNTCTRL) 316 as its output. The flip flop(s) 308 has the chip controls 318 as its input and the latched chip controls (LCCTRL) 320 as its output. The latched external address signal 312 is coupled to the combinatorial logic for the counter input circuit 322. The latched counter controls 316 are also coupled to the combinatorial logic for the counter input circuit 322 and to a combinatorial logic circuit 324. The latched chip controls 320 are coupled to the combinatorial logic circuit 324 as well. The output 326 of the combinatorial logic for the counter input circuit 322 is coupled to a counter register 328. The counter register 328 is clocked at about one half a clock cycle after the flip flops 304, 306, and 308.

At the bottom right of FIG. 4, inside the dashed-line block, there is an example of the combinatorial logic for the counter input circuit 322. A counter mask and mirror registers 418 has as its input the latch counter controls (LCNTCTRL) 316 and the latched external address (LEADD) 312. The output 326 is fed-back directly 420 to the counter mask and mirror registers 418 and coupled to an incrementer 422 whose output is then fed-back to the counter mask and mirror registers 418.

The output or latched internal address signals (LIADD) 330 of the counter register 328 is coupled to the combinatorial logic circuit 324 and (LIADDPx) to address comparator 332. The other input 334 to the address comparator 332 is the latch internal addresses for another port "z" (Pz). The internal address signals (LIADD) 330 are coupled to the address predecoder 336, which has an output 338 coupled to a flip flop 340. The flip flop 340 is clocked one clock cycle after the flip flops 304, 306, and 308. The output 342 of the combinatorial logic circuit 324 is a latch internal write signal (LIW) 342 is coupled to a flip flop 344. The "2" in the flip flops 340 and 344 means that they are clocked one clock cycle after the flip flops 304, 306, and 308. The output 346 of flip flop 344 is a latched/registered internal write signal (LIW) and is coupled to a write pulsing circuit 348. The output 350 of the flip flop 340 is coupled to an address pulsing circuit 352. The output of the write pulsing circuit 348 is a pulsed internal write (PIW) signal 354. The output of the address pulsing circuit 352 is the pulsed predecoded address lines 356 (e.g., PPxRPRE<...> stands for Pulsed Px row predecoded lines). Note that flip flops 340 & 344, as well as the pulsing circuits 348 and 352, are coupled to appropriate port clocks (e.g., 302 or 401, although only 302 is shown in FIG. 4 for illustration purposes).

The output of the address comparator 332 is a match (e.g., MATCHXZ) signal 360. The match signal is coupled to an AND gate 362. The other input to the AND gate 362 is a latched internal write signal Px (LIWPx) 324 (a replica of signal 346). The match signal 360 is also input to a second AND gate 364 that has as its other input the Pz latched internal write PZ (LIWPz) signal 366. The output 368 of the AND gate 362 is the Px writes Pz address signal (similar to 96 or 98 in FIG. 3) and it is coupled to flip flop 370. This flip flop 370 is clocked by a Px clock. The output 372 of AND gate 364 is coupled to flip flop 374. The flip flop 374 is clocked by the Pz clock. The output 376 of flip flop 370 is the Px disables Pz signal (PxDISPz). The output 378 of flip flop 374 is the Pz disables Px signal (PzDISPx).

The PxDISPz signal 376 is coupled to the NAND gate 380. The other input 386 of NAND gate 380 is the output of the NOR gate 384, driven by the PIW signal 354 and the disable arbitration signal (possibly fused). The output of the NAND gate 380 is the Px writes Pz address pulsed bar (PxWPzAPb) signal 382. The output 382 of NAND gate 380 is coupled to an AND gate 388. The AND gate 388 combines other low-going pulses indicating that other ports (e.g., Py—illustrated by signal 390) might try to write Pz's address (the AND gate 388 corresponds to the combined operation of gates 194 and 198 of FIG. 3). The output 392 is then combined in an AND gate 394 (corresponds to the combined gates 202 and 206 in FIG. 3) with the pulsed row predecoded address signals 396 (corresponds to a symbolic AND operation on the 204 and 205 signals of FIG. 3) and the output 398 may be a blocked row predecoder pulse of Pz (corresponding to signal 208 in FIG. 3), further driving the Pz's row decoder.

The port x clock 302 is coupled to a clock conditioner 400 that creates a conditioned clock signal (CCLKPx) 401 for Px. The clock conditioner 400 is coupled to a first clock phase shifter 402. Its output 404 (characterized by about a half a clock cycle shift) is coupled to the flip flop 328 and to a second clock phase shifter 406. The output 408 of phase shifter 406 is the delayed clock for Px signal. This signal 408 is coupled to the reset pulse generator 410, which in one embodiment, is a NAND gate 412 having a delay circuit 414 coupled to one input. The output 416 of the reset pulse generator 410 is the reset pulse coupled to the flip flop 370 of Px. Note that the Px's clock is asynchronous with respect to any other port's clock (in particular Pz), so this clocking circuitry is required for every port.

The address comparator 332 determines if two or more ports are attempting to access the same memory cell. The write detection circuit (registering the resulting signal in flip flops like 344) is combined with match signals (e.g., with gates like 362 and 364) and thus determines if any of the ports attempting to access the same cell are performing a write operation. The arbitration pulse generators set the length of time (e.g., the output 392 of the gate 388) that an "interfering" port is prevented from accessing the memory cell.

It should be noted that the method requires the absence of column addresses. Otherwise, because of the activation of the entire SWL, a "false" same-cell simultaneous write-read condition can be created when one port performs a write on a column while a different column is read by a different port within the same group (block).

Figure 5:
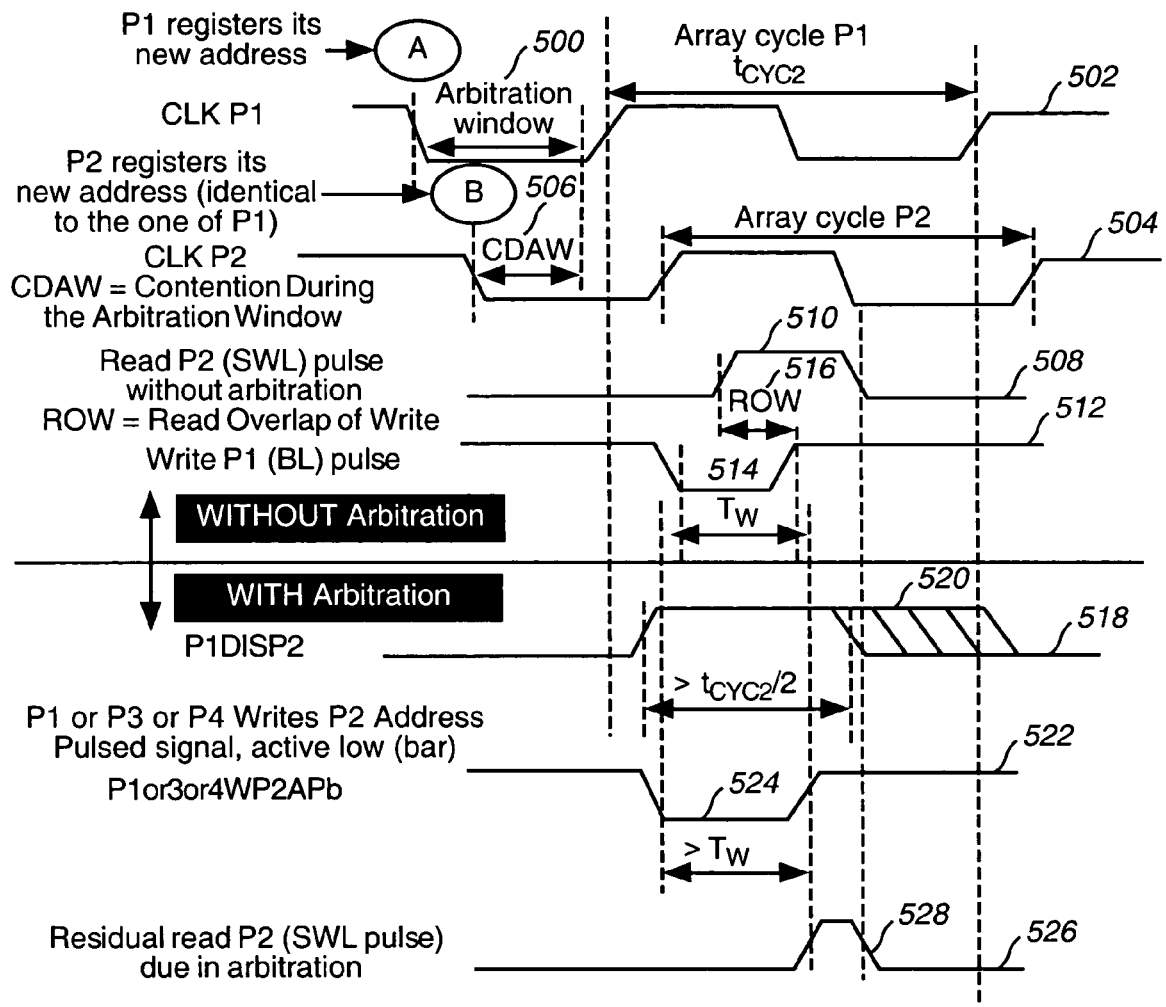
FIG. 5 is a timing diagram for a system for multi-port arbitration in accordance with one embodiment of the invention.

FIG. 5 is a timing diagram for a system using multi-port arbitration in accordance with one embodiment of the invention, and is showing arbitration and non-arbitration collision events. For illustration purposes the colliding ports are assumed to be of the same frequency and the address and write pulses at the cell level are depicted as having equal widths. The arbitration window 500 is slightly smaller than "tCYC/2", namely by the propagation through the full address coincidence detector logic and set-up time of a register for collision conditions—which in one exemplary embodiment may comprise a latch or a register. This means that the arbitration pulse width is equal to a write pulse plus a margin of error.

The first trace 502 shows the clock of port one (P1). The second trace 504 shows the clock of port two and the contention during the arbitration window (CDAW) 506. The third trace 508 shows the port two read (SWL) pulse 510 in the case when arbitration is not used. The fourth trace 512 shows the write (BL) pulse 514 for P1 and the read overlap with write (ROW) period 516. The longer ROW is allowed to occur, the higher the chances for an unsuccessful write operation.

The next traces show the difference when arbitration is enabled. The fifth trace 518 shows the port one disables port two registered arbitration (or "collision detection") pulse 520. Note that while the preferred pulse width is tCYC/2 it may have a different pulse width shown by the multiple fall times of the pulse 520. In other words, the shaded area in the P1DISP2 waveform illustrates the possible active range of the reset pulse, which should arrive after the completion of the arbitration event. The sixth trace 522 is the P2 row predecoder disable pulse 524 (corresponding to signal 200 in FIG. 3). The seventh trace 526 is the residual read (SWL) pulse 528 for P2, cut short due to the arbitration scheme. In the case shown with activated arbitration, the result of the read is not guaranteed—as illustrated in the diagram by the residual read port's SWL pulse. However, the arbitration protects the write operation.

In the example, the user is violating the tCCS (clock-to-clock set-up time) data sheet specification. In order to have a valid read, after a write from another port at the same address, the user has to wait at least tCCS, which is usually slightly shorter than the tCYC (full clock cycle corresponding to the maximum frequency). In one exemplary embodiment, a device with a tCYC of 6 ns would have a tCCS of around 5 ns, and the internal write BL pulse width (TW) and address pulse duration would be approximately 2 ns. In a situation where the read request falls outside the write, there is a case where although a potential arbitration condition is registered or latched, the "colliding" port's internal (SWL) read pulse will not be cut short (because typically TW is significantly narrower than the arbitration window). This would be visible in a situation where the reading port's (P2) clock slides to the right with respect to the writing port's (P1) clock, to the point where there is no read overlap of write (ROW) but there is still a contention during the arbitration window (CDAW).

Thus there has been described a multi-port arbitration system and method that can be used on systems having any number of ports. The system does not have or require a priority channel and does not prevent multiple reads. The system blocks other operations for a minimum amount of time necessary to ensure that there is no corruption of the newly written information.

While the invention has been described in conjunction with specific embodiments thereof, it is evident that any alterations, modifications, and variations will be apparent to those skilled in the art in light of the foregoing description. Accordingly, it is intended to embrace all such alterations, modifications, and variations in the appended claims.

What is claimed is:

1. A multi-port arbitration system, comprising:
   a write detection circuit configured to detect one or more write operations and generate a signal based on the detected operations, the write detection circuit coupled to each of a plurality of ports, wherein the plurality of ports is greater than two;
   an address coincidence detector coupled to the write detection circuit and each of the plurality of ports and configured to detect when two or more of the plurality of ports is addressing the same cell during a write operation;
   a plurality of clocks for the plurality of ports, wherein each of the plurality of ports is coupled with a different clock; and
   a deactivation pulse generator circuit coupled to the address coincidence detector and configured to generate a deactivation pulse synchronous with a first clock of the plurality of clocks and asynchronous with at least a second clock of the plurality of clocks, and to deactivate all but one of the two or more of the plurality of ports attempting to address the same cell during a write operation.

2. The system of claim 1, wherein an output of the write detection circuit is logically combined with an output of the address coincidence detector.

3. The system of claim 2, wherein an output of the logical combination is a disable signal.

4. The system of claim 3, wherein the disable signal is coupled to the deactivation pulse generator circuit.

5. The system of claim 1, wherein the plurality of clocks are asynchronous.

6. A multi-port arbitration system, comprising:
   an address comparator coupled to a write detection circuit, wherein the address comparator and the write detection circuit are coupled to a plurality of ports, the address comparator configured to generate a match signal and the write detection circuit configured to include logic to determine if two or more of the plurality of ports is addressing the same cell during a write operation;
   a plurality of clocks for the plurality of ports, wherein each of the plurality of ports is coupled with a different clock; and
   arbitration logic configured to generate a deactivation pulse for disabling at least one of the ports when two or more of the plurality of ports are attempting to address the same cell during a write operation, wherein the deactivation pulse is synchronous with a first clock of the plurality of clocks, and asynchronous with a second clock of the plurality of clocks.

* * * * *